United States Patent
Takagi et al.

(10) Patent No.: US 7,133,259 B2
(45) Date of Patent: Nov. 7, 2006

(54) HEAD SUSPENSION FOR DISK DRIVE AND METHOD OF MANUFACTURING HEAD SUSPENSION

(75) Inventors: Yasuji Takagi, Yokohama (JP); Osamu Iriuchijima, Yokohama (JP); Masao Hanya, Yokohama (JP); Tsukasa Higashi, Yokohama (JP); Takumi Karasawa, Yokohama (JP)

(73) Assignee: NHK Spring Co., Ltd., Yokohama (JP)

( * ) Notice: Subject to any disclaimer, the term of this patent is extended or adjusted under 35 U.S.C. 154(b) by 0 days.

(21) Appl. No.: 10/145,526

(22) Filed: May 14, 2002

(65) Prior Publication Data

US 2002/0181155 A1 Dec. 5, 2002

(30) Foreign Application Priority Data

Jun. 4, 2001 (JP) ............................ 2001-168897
Jun. 7, 2001 (JP) ............................ 2001-173283

(51) Int. Cl.
G11B 5/48 (2006.01)

(52) U.S. Cl. .............................. 360/244.3; 360/244.5; 360/244.8; 360/244.9

(58) Field of Classification Search ............ 360/244.3, 360/244.5, 244.8, 244.9
See application file for complete search history.

(56) References Cited

U.S. PATENT DOCUMENTS

| | | | |
|---|---|---|---|
| 4,167,765 A | 9/1979 | Watrous | |
| 4,760,478 A * | 7/1988 | Pal et al. ................. | 360/244.3 |
| 4,991,045 A | 2/1991 | Oberg | |
| 5,187,625 A | 2/1993 | Blaeser et al. | |
| 5,282,103 A | 1/1994 | Hatch et al. | |
| 5,650,894 A | 7/1997 | Ikeda | |
| 5,719,727 A | 2/1998 | Budde | |
| 5,777,826 A | 7/1998 | Tsuchida et al. | |
| 5,793,569 A * | 8/1998 | Christianson et al. .... | 360/244.3 |
| 5,949,615 A | 9/1999 | Hernandez | |
| 6,055,133 A | 4/2000 | Albrecht et al. | |
| 6,141,187 A | 10/2000 | Wong et al. | |
| 6,215,622 B1 * | 4/2001 | Ruiz et al. ............... | 360/244.3 |
| 6,382,499 B1 | 5/2002 | Satoh et al. | |
| 6,388,842 B1 | 5/2002 | Murphy | |
| 6,597,538 B1 | 7/2003 | Kashima et al. | |
| 6,697,227 B1 | 2/2004 | Kashima et al. | |
| 6,700,745 B1 * | 3/2004 | Shiraishi .................. | 360/244.3 |
| 6,721,133 B1 | 4/2004 | Takagi et al. | |
| 6,898,059 B1 | 5/2005 | Horie et al. | |
| 6,940,696 B1 | 9/2005 | Takagi et al. | |
| 6,956,720 B1 | 10/2005 | Takagi et al. | |
| 6,967,820 B1 | 11/2005 | Horie et al. | |

(Continued)

FOREIGN PATENT DOCUMENTS

JP 2002-133809 5/2002

*Primary Examiner*—Robert S Tupper
(74) *Attorney, Agent, or Firm*—Jordan and Hamburg LLP

(57) ABSTRACT

A head suspension for a disk drive has a base (19) to be attached to a carriage, a load beam (21) having a rigid part (27) and a resilient part (29) supported by the base, to apply load on a data read/write head (13) arranged at a front end (27a) of the rigid part, and a flexure (49) attached to the load beam and supporting the head. The rigid part has a multi-layer structure consisting of at least three layers including metal layers (28a, 28b) and a resin layer (28c) interposed between the metal layers. The number of layers of the resilient part is smaller than that of the rigid part.

18 Claims, 20 Drawing Sheets

U.S. PATENT DOCUMENTS

| | | |
|---|---|---|
| 2001/0008475 A1 | 7/2001 | Takagi et al. |
| 2003/0002220 A1 | 1/2003 | Nojima |
| 2003/0161074 A1 | 8/2003 | Horie et al. |
| 2003/0179501 A1 | 9/2003 | Takagi et al. |
| 2004/0120076 A1 | 6/2004 | Takagi et al. |
| 2005/0045601 A1 | 3/2005 | Kashima |

* cited by examiner

Fig.15

| PARTS | THICKNESS | RELATED ART | 3-LAYER STRUCTURE | |
|---|---|---|---|---|
| | | t100 SUS Beam [mg] | t25 SUS, t50 PI, t25 SUS Beam [mg] | t38 SUS, t42 PI, t20 SUS [mg] |
| BASE PLATE | t0.15mm | 14.1 | 14.1 | 14.1 |
| LOAD BEAM | t0.1mm | 26.3 | 15.9(with Hinge) | 17.4(with Hinge) |
| RESILIENT PART | t38um | 5.0 | | |
| FLEXURE | | 4.0 | 4.0 | 4.0 |
| SLIDER | | 1.6 | 1.6 | 1.6 |
| TOTAL | | 51.0 | 35.6 | 37.1 |

Fig.20

| | LOAD BEAM | WEIGHT (mg) | RESONANCE CHARACTERISTICS | | T1 TORSIONAL ANGLE (deg) BY AIR DISTURBANCE | T1 OFF-TRACK BY AIR DISTURBANCE |
| --- | --- | --- | --- | --- | --- | --- |
| | | | T1 (kHz) | SWAY (kHz) | | |
| 3-LAYER STRUCTURE | SUS t=38μm PI t=42 SUS t=20 | 37.1 | 9.0 Fig.16A | 17.8 Fig.17A | 0.0004 Fig.18A | SMALL Figs.16A,19A |
| RELATED ART | SUS t=51 | 49.1 | 5.0 Fig.16B | 12.5 Fig.17B | 0.005 Fig.18B | LARGE Figs.16B,19B |
| ADVANTAGE | | LIGHT | HIGH RESONANCE POINT | HIGH RESONANCE POINT | RESISTIVE TO AIR DISTURBANCE WITH T1 | SMALL OFF-TRACK TO IMPROVE READ/WRITE |

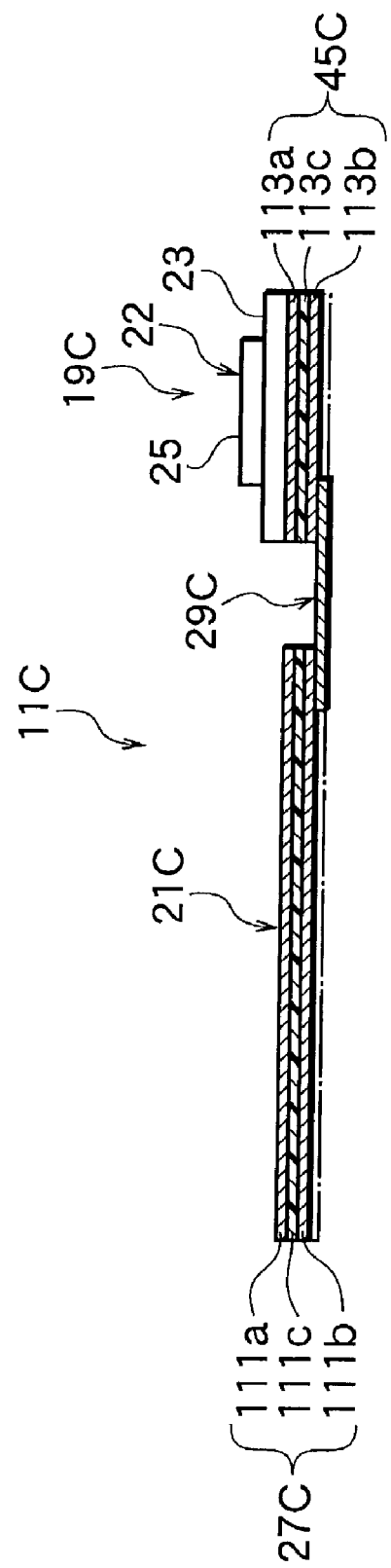

HEAD SUSPENSION FOR DISK DRIVE AND METHOD OF MANUFACTURING HEAD SUSPENSION

BACKGROUND OF THE INVENTION

1. Field of the Invention

The present invention relates to a head suspension for a disk drive installed in an information processing apparatus such as a personal computer, and a method of manufacturing the head suspension.

2. Description of the Related Art

A hard disk drive (HDD) records and reproduces information to and from rotating magnetic or magneto-optical disks. The disks are supported with a carriage that is turned around a spindle by a positioning motor.

An example of the carriage is disclosed in U.S. Pat. No. 4,167,765. The carriage of this disclosure includes a carriage arm, a head suspension attached to a front end of the carriage arm, a head attached to the head suspension, and a slider attached to the head. The slider faces a disk. When the disk is rotated at high speed, the slider slightly floats from the disk, and an air bearing is formed between the disk and the slider.

The head suspension includes a load beam made of a precision thin plate spring, a flexure made of a very thin plate spring fixed to a front end of the load beam by, for example, laser welding, and a base plate fixed to a base of the load beam by, for example, laser welding. The base plate is attached to a suspension attaching face of the carriage arm.

Recent hard disk drives employ high-density disks and drive the disks at high speed. Such high-density disks involve narrow tracks, and therefore, disturbances due to, for example, airflow and disk fluttering result in moving the head away from a track center.

It is important to control such disturbances and increase controllable bands, to maintain the head on a track center.

It is also important to control the amplitudes and frequencies of various resonance modes and air disturbances concerning the head suspensions and carriage arms between the actuator and the sliders in the disk drive. The recent high-density, high-speed disks require head suspensions of high rigidity and low spring constant.

FIG. 1 shows a head suspension 201 for a disk drive according to a related art. The head suspension 201 has a load beam 203 consisting of a rigid part 203a of L1 in length and a resilient part 203b of L2 in length. The rigid part 203a and resilient part 203b are integrally formed from a single metal plate. It is difficult, therefore, to simultaneously satisfy high rigidity for the rigid part 203a and a low spring constant for the resilient part 203b.

The rigid part 203a improves torsional rigidity if it is thickened. This, however, increases the weight of the rigid part 203a. The material and thickness of the rigid part 203a are restricted by those of the resilient part 203b. Namely, it is impossible to thicken the rigid part 203a separately from the resilient part 203b.

FIGS. 2 and 3 show a head suspension disclosed in U.S. Pat. No. 5,187,625. The head suspension 201A has a rigid part 203a and a resilient part 203b and is supported by a carriage arm through a base plate 209. Parts corresponding to those of FIG. 1 are represented with like reference numerals.

FIG. 3 is a sectional view taken along a line SC—SC of FIG. 2. A load beam 203 of the head suspension 201A has a three-layer structure. Namely, the load beam 203 consists of two metal plates 217 and 219 and a resin layer 221 interposed between the metal plates 217 and 219, to damp various resonance modes of the head suspension 201A.

In the head suspension 201A, the resilient part 203b has also a three-layer cross section like the rigid part 203a, and therefore, it is difficult to provide a low spring constant and correctly apply spring load.

The head suspension 201A has a channel 205 formed by bending the three-layer structure. Bending such a multilayer structure is difficult to correctly achieve and increases cost.

SUMMARY OF THE INVENTION

The present invention provides a head suspension for a disk drive, capable of realizing required performance and a method of manufacturing the head suspension.

A first aspect of the present invention provides a head suspension for a disk drive, having a base to be attached to a carriage, a load beam having a rigid part and a resilient part supported by the base, to apply load on a data read/write head arranged at a front end of the rigid part, and a flexure attached to the load beam and being provided with the head. The rigid part has a multilayer structure consisting of at least three layers including metal layers and a resin layer interposed between the metal layers. The number of layers of the resilient part is smaller than that of the rigid part.

In the head suspension of the first aspect, a second aspect of the present invention provides the rigid part with a three-layer structure consisting of two metal layers and a resin layer interposed between the metal layers and integrally forms the resilient part with one of the metal layers of the rigid part at an end of the rigid part. Opposite the rigid part, the resilient part has an integral reinforcing metal layer to reinforce the base. The reinforcing metal layer, another reinforcing metal layer, and a resin layer interposed between the reinforcing metal layers form a multilayer reinforcing part consisting of at least three layers. The reinforcing part is attached to a base plate, to form the base to be attached to the carriage.

In the head suspension of the first aspect, a third aspect of the present invention provides the rigid part with a three-layer structure consisting of two metal layers and a resin layer interposed between the metal layers and integrally forms the resilient part with one of the metal layers of the rigid part at an end of the rigid part. Opposite the rigid part, the resilient part has an integral support. The support is attached to a base plate, to form the base to be supported to the carriage.

A fourth aspect of the present invention provides a head suspension for a disk drive, having a base to be attached to a carriage, a load beam having a rigid part and a resilient part supported by the base, to apply load on a data read/write head arranged at a front end of the rigid part, and a flexure attached to the load beam and being provided with the head. The rigid part has a multilayer structure consisting of at least three layers including metal layers and a resin layer interposed between the metal layers. The base has a multilayer structure consisting of at least three layers including reinforcing metal layers and a resin layer interposed between the reinforcing metal layers. The resilient part has a multilayer structure consisting of at least two layers including a metal layer and a resin layer, the metal layer of the resilient part being integral with a corresponding one of the metal layers of the rigid part and a corresponding one of the reinforcing metal layers of the base, the resin layer of the resilient part being integral with the resin layers of the rigid part and base.

The number of the layers of the resilient part is smaller than any one of those of the rigid part and base.

A fifth aspect of the present invention provides a head suspension for a disk drive, having a base to be attached to a carriage, a load beam having a rigid part and a resilient part supported by the base, to apply load on a data read/write head arranged at a front end of the rigid part, and a flexure attached to the load beam and being provided with the head. The rigid part has a multilayer structure consisting of at least three layers including metal layers and a resin layer interposed between the metal layers. The base has a multilayer structure consisting of at least three layers including reinforcing metal layers and a resin layer interposed between the reinforcing metal layers. The resilient part is independent of the rigid part and base and is joined to one of the metal layers of the rigid part and one of the reinforcing metal layers of the base.

In the head suspension of any one of the first to fifth aspects, a sixth aspect of the present invention forms lightening holes in the resin layer and one metal layer of the rigid part at a position where the flexure is fixed to the other metal layer of the rigid part.

In the head suspension of any one of the second, fourth, and fifth aspects, a seventh aspect of the present invention provides the base with a base plate to be attached to the carriage. The base plate is fixed to one of the reinforcing metal layers of the base at a position where lightening holes are formed in the other reinforcing metal layer and resin layer of the base.

In the head suspension of any one of the sixth and seventh aspects, an eighth aspect of the present invention forms the lightening holes by etching.

In the head suspension of any one of the first to eighth aspects, a ninth aspect of the present invention provides at least one of the metal layers of the rigid part with a plastically processed part.

To manufacture the head suspension of any one of the first to ninth aspects, a tenth aspect of the present invention prepares a multilayer base material consisting of at least three layers including metal layers and a resin layer interposed between the metal layers and partly removes the multilayer base material, to form the base and the load beam including the rigid and resilient parts.

To manufacture the head suspension of the tenth aspect, an eleventh aspect of the present invention partly removes the multilayer base material by etching.

According to the first aspect, the rigid part is provided with a multilayer structure consisting of at least three layers including metal layers and a resin layer interposed between the metal layers. The number of layers of the resilient part is smaller than that of the rigid part. With this structure, the first aspect reduces the total weight of the head suspension, improves the rigidity of the rigid part, realizes a low spring constant for the resilient part, and presents a damping effect of the resin layer.

The first aspect reduces the weight of the head suspension as a whole, decreases the amplitudes of various resonance modes, and increases resonance frequencies. The first aspect minimizes air disturbance when disks in the disk drive are rotated at high speed and surely prevents the head suspension from fluttering due to air disturbance.

The multilayer structure of the rigid part improves the rigidity thereof, and therefore, needs no rigidity improving bends or ribs. This minimizes air resistance or disturbance when disks in the disk drive are rotated at high speed and surely prevents the head suspension from fluttering.

In addition to the effects of the first aspect, the second aspect provides an effect that the three-layer rigid part including metal layers and a resin layer interposed between the metal layers reduces the weight thereof, improving the rigidity thereof, and provides a damping effect.

According to the second aspect, the resilient part is formed at an end of the rigid part integrally with one of the metal layers of the rigid part. The rigid part improves rigidity due to the three-layer structure, and the resilient part realizes a low spring constant due to the single-layer structure.

According to the second aspect, the resilient part has an integral reinforcing metal layer to reinforce the base. The reinforcing metal layer, another reinforcing metal layer, and a resin layer interposed between the reinforcing metal layers form a multilayer reinforcing part consisting of at least three layers. The reinforcing part is attached to a base plate, to form the base to be attached to the carriage. The second aspect reduces the weight of the head suspension, surely reinforces the base plate, and stably supports the load beam on the carriage.

The second aspect reduces the weight of the head suspension as a whole, decreases the amplitudes of various resonance modes, increases resonance frequencies, and surely prevents the head suspension from fluttering due to air disturbance.

In addition to the effects of the first aspect, the third aspect provides an effect that the three-layer rigid part including metal layers and a resin layer interposed between the metal layers reduces the weight of the rigid part, improves the rigidity of the same, and provide a damping effect.

The third aspect provides the rigid part with a three-layer structure consisting of two metal layers and a resin layer interposed between the metal layers and forms the resilient part at an end of the rigid part integrally with one of the metal layers of the rigid part. Opposite the rigid part, the resilient part has an integral support. The support is supported to a base plate, to form the base to be attached to the carriage. The three-layer rigid part realizes high rigidity, and the single-layer resilient part secures a low spring constant.

The third aspect reduces the weight of the head suspension as a whole, decreases the amplitudes of various resonance modes, increases resonance frequencies, and surely prevents the head suspension from fluttering due to air disturbance.

According to the fourth aspect, the three-layer rigid part including metal layers and a resin layer interposed between the metal layers reduces the weight of the rigid part, improves the rigidity thereof, and provides a damping effect.

According to the fourth aspect, the multilayer base consisting of at least three layers including reinforcing metal layers and a resin layer interposed between the reinforcing metal layers reduces the weight of the base, reinforces the same, and secures the load beam to a carriage in the disk drive.

According to the fourth aspect, the multilayer resilient part consists of at least two layers including a metal layer and a resin layer, the metal layer of the resilient part being integral with a corresponding one of the metal layers of the rigid part and a corresponding one of the reinforcing metal layers of the base, the resin layer of the resilient part being integral with the resin layers of the rigid part and base. The number of the layers of the resilient part is smaller than any one of those of the rigid part and base, so that the resilient part may secure a low spring constant.

The fourth aspect reduces the weight of the head suspension as a whole, further decreases the amplitudes of various resonance modes, increases resonance frequencies, and surely prevents the head suspension from fluttering due to air disturbance.

According to the fifth aspect, the multilayer rigid part consisting of at least three layers including metal layers and a resin layer interposed between the metal layers reduces the weight of the rigid part, improves the rigidity thereof, and provides a damping effect.

According to the fifth aspect, the multilayer base consisting of at least three layers including reinforcing metal layers and a resin layer interposed between the reinforcing metal layers reduces the weight of the base, reinforces the same, and secures the load beam to a carriage in the disk drive.

According to the fifth aspect, the resilient part is independent of the rigid part and base and is joined to one of the metal layers of the rigid part and one of the reinforcing metal layers of the base, to make the resilient part free from the influences of the rigid part and base and secure a low spring constant.

The fifth aspect reduces the weight of the head suspension as a whole, further decreases the amplitudes of various resonance modes, increases resonance frequencies, and surely prevents the head suspension from fluttering due to air disturbance.

In addition to the effects of the first to fifth aspects, the sixth aspect provides an effect by forming lightening holes in the resin layer and one metal layer of the rigid part at a position where the flexure is fixed to the other metal layer of the rigid part. When the flexure is welded to the rigid part, the lightening holes prevent the resin layer and joint faces between the metal layers and the resin layer from being affected by welding heat. The sixth aspect surely fixes the flexure to the rigid part and secures the rigidity of the rigid part.

In addition to the effects of the second, fourth, and fifth aspects, the seventh aspect demonstrates an effect by providing the base with a base plate to be attached to the carriage. The base plate is fixed to one of the reinforcing metal layers of the base at a position where lightening holes are formed in the other reinforcing metal layer and resin layer of the base. When the base plate is welded to the one reinforcing metal layer, the lightening holes prevent the resin layer and joint faces between the reinforcing metal layers and the resin layer from being affected by welding heat. The seventh aspect surely fixes the base plate to the reinforcing metal plate and secures the reinforcing function of the three-layer base.

In addition to the effects of the sixth and seventh aspects, the eighth aspect provides an effect by precisely forming the lightening holes by etching.

In addition to the effects of the first to eighth aspects, the ninth aspect demonstrates an effect by providing at least one of the metal layers of the rigid part with a plastically processed part. The ninth aspect forms a channel and a dimple only on one of the metal layers of the rigid part without processing the three-layer structure of the rigid part as a whole. As a result, the ninth aspect is capable of easily and correctly forming the channel and dimple.

In addition to the effects of the first to ninth aspects, the tenth aspect provides an effect by preparing a multilayer base material consisting of at least three layers including metal layers and a resin layer interposed between the metal layers and by partly removing the multilayer base material, to form the base and the load beam including the rigid part and resilient part. The tenth aspect is capable of easily and precisely forming the head suspension.

In addition to the effects of the tenth aspect, the eleventh aspect provides an effect by partly removing the multilayer base material by etching. The eleventh aspect is capable of easily and precisely forming the head suspension.

BRIEF DESCRIPTION OF THE DRAWINGS

FIGS. 10A to 10E show a method of manufacturing the load beam of the first embodiment in which FIG. 10A shows a multilayer base material forming process, FIG. 10B shows resist coating, exposing, developing processes, FIG. 10C shows an stainless steel etching process, FIG. 10D shows a resist removing process, and FIG. 10E shows a resin etching process;

FIG. 15 is a table showing a weight comparison between the first embodiment and a related art;

FIG. 20 is a table showing a comparison between the characteristics of the first embodiment and related art;

FIG. 24 is a sectional view showing a head suspension for a disk drive according to a fourth embodiment of the present invention.

DETAILED DESCRIPTION OF EMBODIMENTS

First Embodiment

Figure 4:
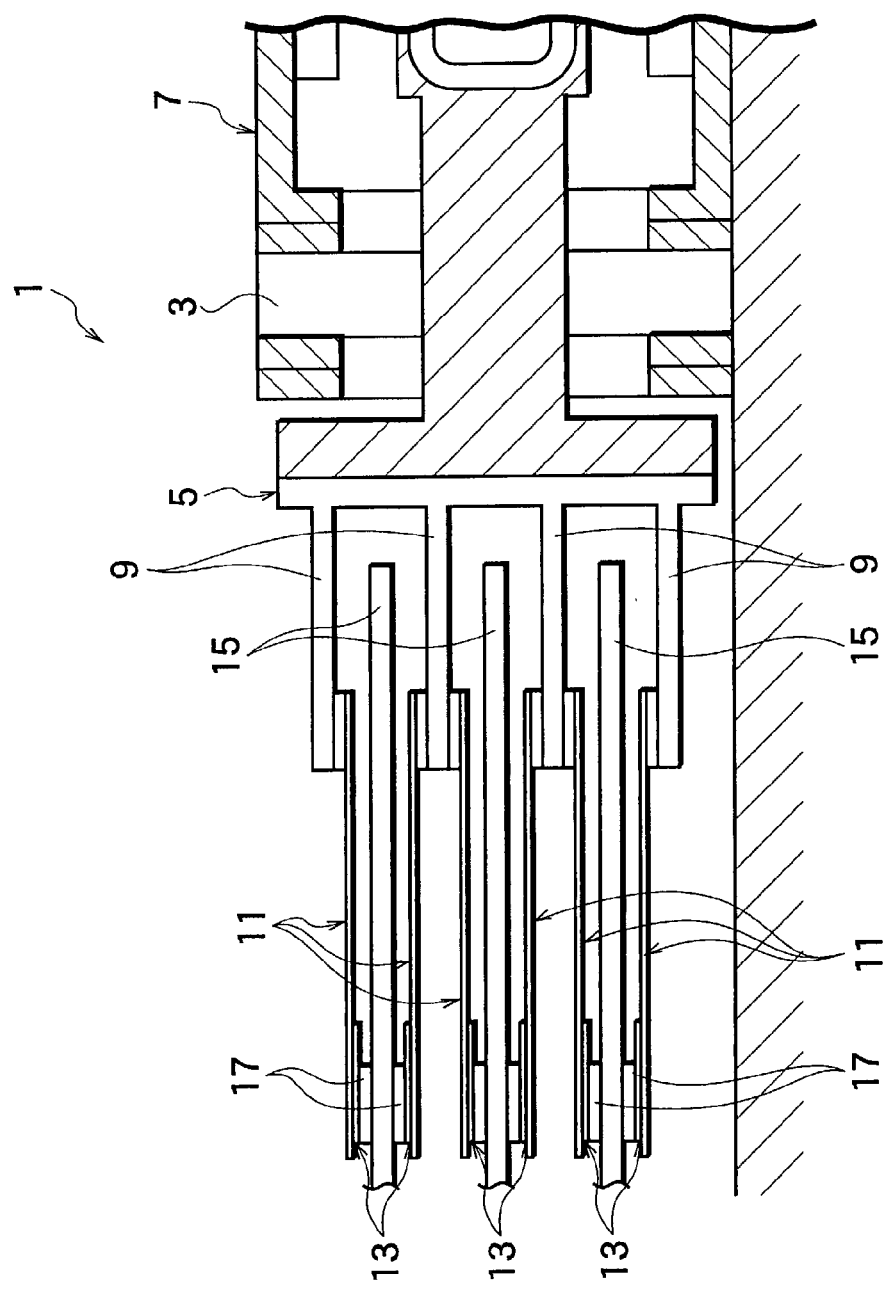
FIG. 4 is a sectional view partly showing a hard disk drive incorporating head suspensions according to a first embodiment of the present invention.

FIG. 4 is a sectional view partly showing a hard disk drive incorporating head suspensions according to the first embodiment of the present invention. The hard disk drive 1 has a carriage 5. The carriage 5 is driven by a positioning motor 7 such as a voice coil motor and turns around a spindle 3. The carriage 5 has a plurality of (four in FIG. 1) carriage arms 9 each supporting the head suspension 11 at a front end thereof. The head suspension 11 has a head 13 at a front end thereof.

The carriage 5 is turned around the spindle 3, to move the heads 13 onto target tracks on disks 15. Each head 13 has a slider 17 facing tracks on the disk 15. The slider holds a transducer (not shown).

When the disks 15 are rotated at high speed, air enters between the disks 15 and the sliders 17, so that the sliders 17 slightly float from the disks 15 and air bearings are formed between the disks 15 and the sliders 17.

Figure 5:
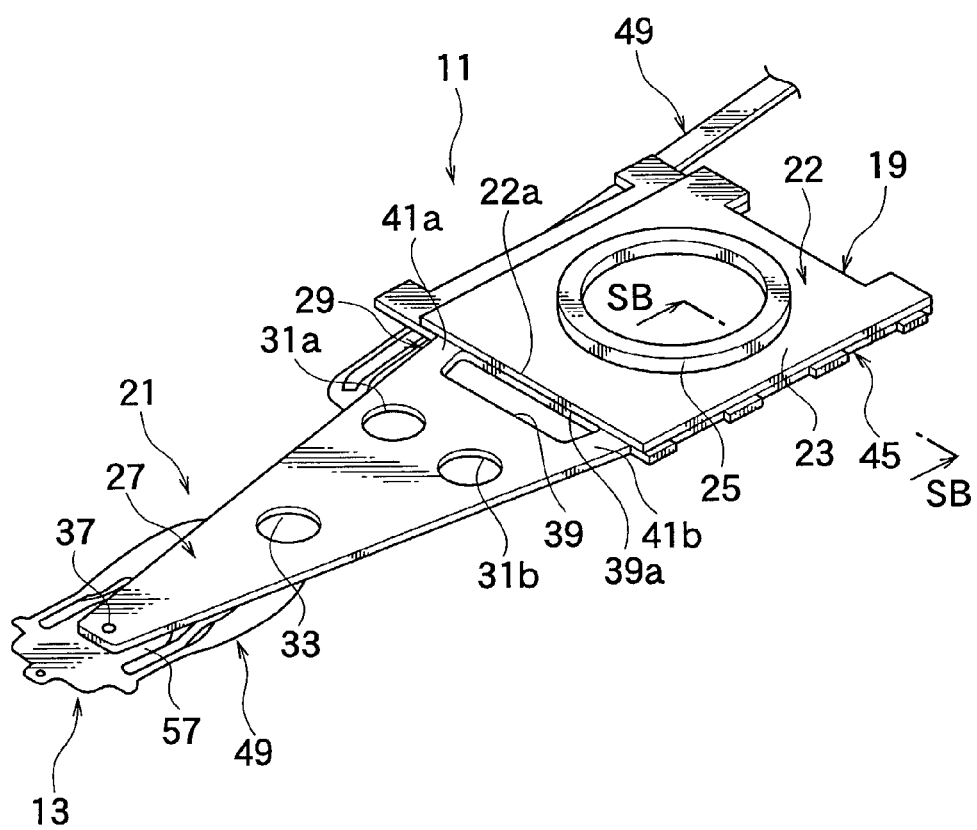
FIG. 5 is a perspective view showing the head suspension of the first embodiment seen from opposite a flexure.

FIG. 5 is a perspective view showing one of the head suspensions 11 seen from opposite a flexure 49. The head suspension 11 has a base 19 and a load beam 21.

The base 19 has a base plate 22 attached to the carriage arm 9 (FIG. 4). The base plate 22 is made of, for example, stainless steel and has a flange 23 and a boss 25.

According to the first embodiment, the flange 23 has a rectangular plan shape and a thickness of, for example, t=0.15 mm. The flange 23 may have a circular plan shape.

The boss 25 is fitted to a hole formed in the carriage arm 9 (FIG. 4), and the diameter of the boss 25 is expanded with a jig to fix the base plate 22 to the carriage arm 9.

Figure 6:
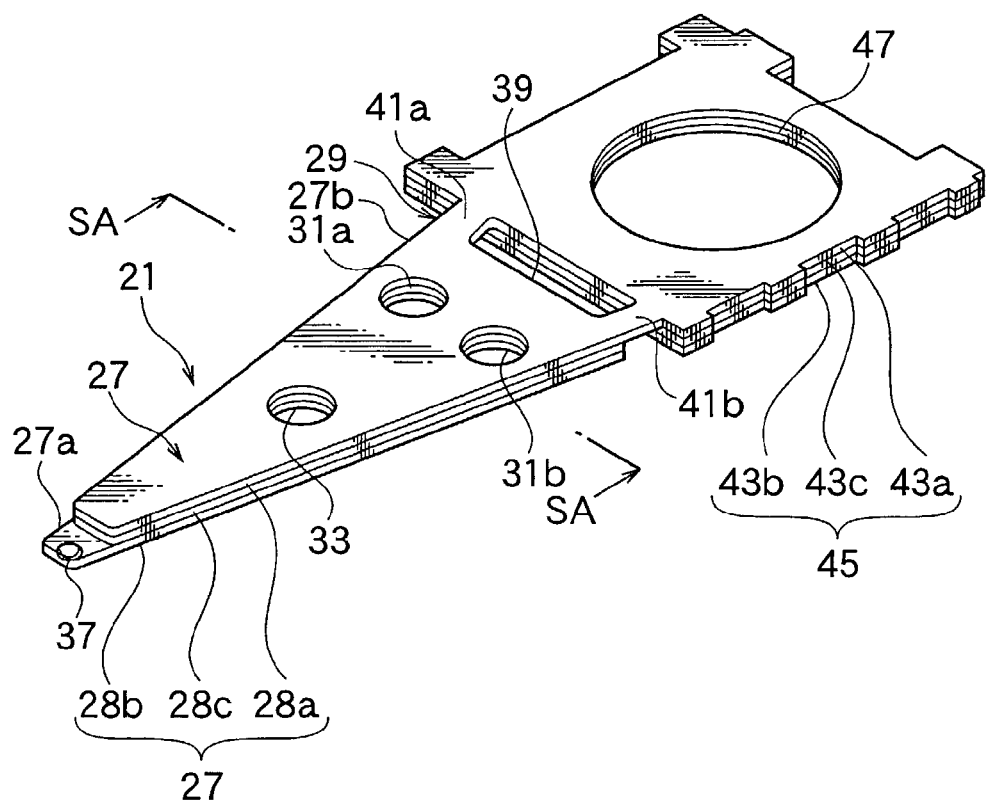
FIG. 6 is a perspective view showing a load beam of the head suspension of the first embodiment.

The load beam 21 applies load on the slider 17 of the head 13 arranged at a front end of the load beam 21. Referring also to FIG. 6, the load beam 21 has a rigid part 27 and a resilient part 29. The rigid part 27 has a triangular shape that gradually narrows from a base end 27b toward a front end 27a. The thickness of the rigid part 27 is, for example, t=100 mm.

Figure 7:
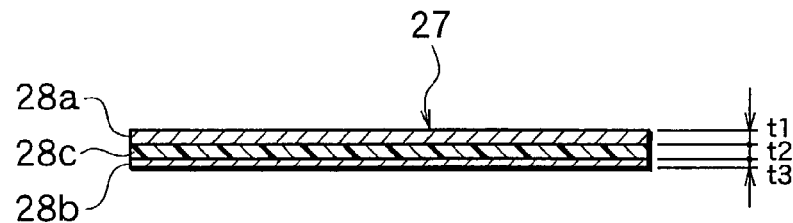
FIG. 7 is a sectional view taken along a line SA—SA of FIG. 6.

FIG. 7 is a sectional view taken along a line SA—SA of FIG. 6. The rigid part 27 has a three-layer structure consisting of metal layers 28a and 28b and a resin layer 28c interposed between the metal layers 28a and 28b and bonded together. The metal layers 28a and 28b are made of, for example, stainless steel. The thickness of the metal layer 28a is, for example, t1=38 mm, and that of the metal layer 28b is, for example, t3=20 mm. The resin layer 28c is made of, for example, polyimide resin or epoxy resin and has a thickness of, for example, t2-42 mm. The total of the thicknesses t1, t3, and t2 of the layers 28a, 28b, and 28c is set to be 100 mm. These thicknesses are only examples and may be set to other values.

The rigid part 27 has through holes 31a, 31b, and 33. The holes 31a and 31b are to lighten the weight of the head suspension 11, and the hole 33 is to position the flexure 49. The holes 31a, 31b, and 33 are formed by, for example, etching.

The front end 27a of the rigid part 27 is made of only the metal layer 28b. The front end 27a is made by, for example, etching off the metal layer 28a and resin layer 28c. A dimple 37 is formed in the front end 27a by pressing and is in contact with a tongue of the flexure 49.

According to the first embodiment, the dimple 37 is plastically formed only on the metal layer 28b. Compared with forming the dimple 37 on the three-layer rigid part 27, forming the dimple 37 only on the metal layer 28b is easier and more precise.

The resilient part 29 is integral with the metal layer 28a of the rigid part 27 and is located at an end of the rigid part 27. The number of layers of the resilient part 29 is smaller than that of the rigid part 27 and is, for example, one. According to the first embodiment, the resilient part 29 is made of stainless steel and has a thickness of t=38 mm. The resilient part 29 has an opening 39 and sides 41a and 41b to provide a low spring constant.

Opposite the rigid part 27, the resilient part 29 has an integral reinforcing metal layer 43a to reinforce the base 19. According to the first embodiment, the metal layer 43a is made of stainless steel and has a thickness of t=38 mm. The metal layer 43a, another reinforcing metal layer 43b, and a resin layer 43c interposed between the metal layers 43a and 43b are bonded together to form a three-layer reinforcing part 45.

The reinforcing metal layers 43a and 43b and resin layer 43c of the reinforcing part 45 correspond to the metal layers 28a and 28b and resin layer 28c of the rigid part 27. The metal layer 43b is made of stainless steel and has a thickness of t=20 mm. The resin layer 43c is made of polyimide resin or epoxy resin and has a thickness of t=42 mm.

The reinforcing part 45 has a rectangular plan shape that substantially corresponds to the plan shape of the flange 23 of the base plate 22.

In FIG. 5, the reinforcing part 45 is attached to the base plate 22 and fixed thereto at positions 48 by, for example, laser welding. At this time, a front edge 22a of the base plate 22 agrees with a rear edge 39a of the opening 39 of the resilient part 29. When the base plate 22 is attached to the carriage 5, the base plate 22 surely holds the end of the resilient part 29, and the resilient part 29 resiliently supports the rigid part 27, to correctly provide required functions.

The flange 23 of the base plate 22 may be scaled down so that the front edge 22a comes closer to the boss 25 from the rear edge 39a of the opening 39. The flange 23 may be circular round the boss 25.

In FIG. 5, the flexure 49 is attached to the rigid part 27. The flexure 49 has terminals (not shown). The flexure 49 is made of a metal substrate, which may be a resilient thin rolled stainless steel plate, an insulating layer formed on the metal substrate, and conductors formed on the insulating layer. The number of the conductors is, for example, four. One ends of the conductors are connected to terminals of the head 13, and the other ends thereof are connected to rear terminals. The flexure 49 has the tongue 57 that supports the slider 17. The tongue 57 is in contact with the dimple 37 of the rigid part 27. The flexure 49 is welded to the rigid part 27 at a weld spot 61 and to the reinforcing part 45 at a weld spot 63.

Figure 8:
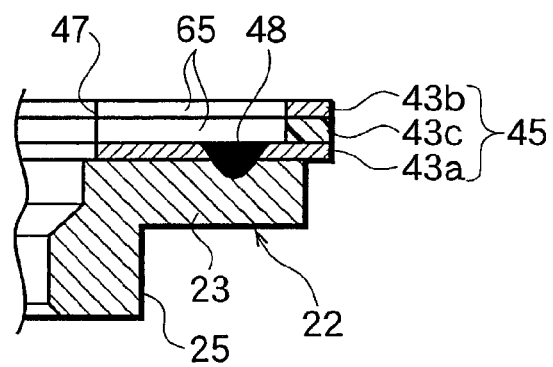
FIG. 8 is a sectional view taken along a line SB—SB of FIG. 5.
Figure 9:
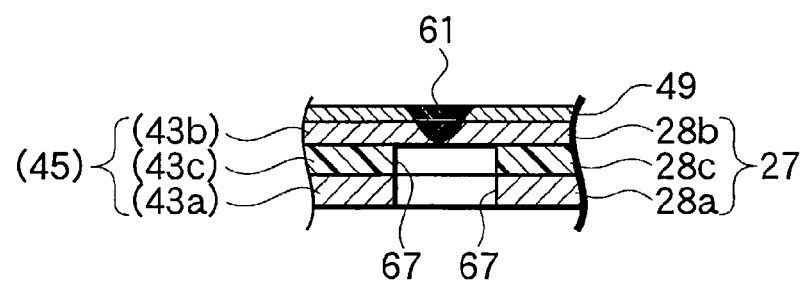
FIG. 9 is a sectional view showing weld spots of the load beam of the first embodiment.

Welding the base plate 22 to the reinforcing part 45 and welding the flexure 49 to the rigid part 27 and reinforcing part 45 are carried out as shown in FIGS. 8 and 9. FIG. 8 is a sectional view showing a weld spot 48 on the base plate 22, and FIG. 9 is a sectional view showing the weld spot 61 on the flexure 49.

Referring to FIGS. 5 and 8, the flange 23 of the base plate 22 is fixed to the reinforcing metal layer 43a of the reinforcing part 45 through the weld spot 48 by, for example, laser welding. Corresponding to the weld spot 48, a lightening hole 65 is formed in the reinforcing metal layer 43*b* and resin layer 43*c* by, for example, etching. When the base plate 22 is welded to the reinforcing part 45, the lightening hole 65 prevents heat at the weld spot 48 from affecting the resin layer 43*c* and joint faces between the resin layer 43*c* and the reinforcing metal layers 43*a* and 43*b*. The lightening hole 65 is effective to surely join the base plate 22 and reinforcing part 45 together and ensure the reinforcing function of the reinforcing part 45.

FIG. 9 shows the weld spot 61 between the flexure 49 and the rigid part 27 or the reinforcing part 45 (indicated with parentheses). The weld spot 61 on the rigid part 27 will be explained. The flexure 49 is welded to the metal layer 28*b* of the rigid part 27 through the weld spot 61. At the weld spot 61, a lightening hole 67 is formed in the metal layer 28*a* and resin layer 28*c* by, for example, etching. The lightening hole 67 is effective to surely weld the flexure 49 to the rigid part 27 through the weld spot 61, prevent welding heat from affecting the resin layer 28*c* and joint faces between the resin layer 28*c* and the metal layers 28*a* and 28*b*.

Figure 10A:
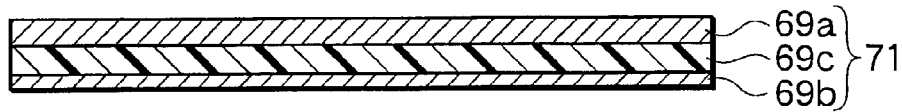
Figure 10B:
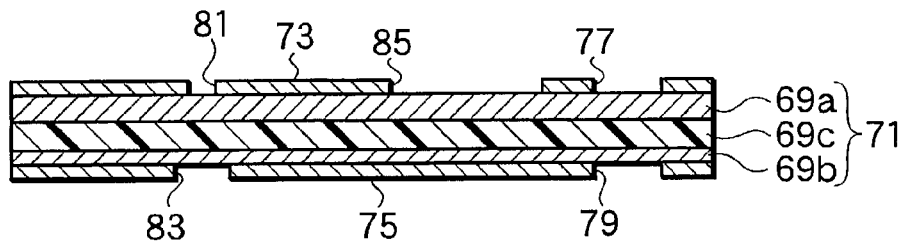
Figure 10C:
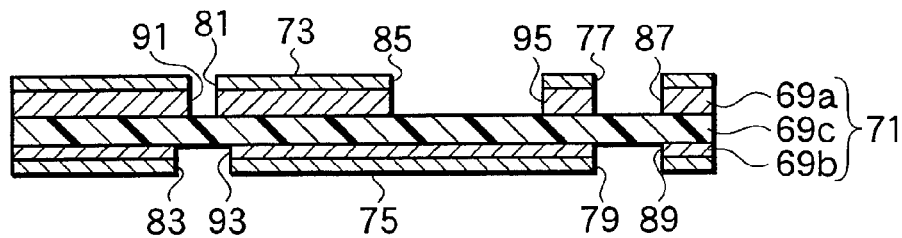
Figure 10D:
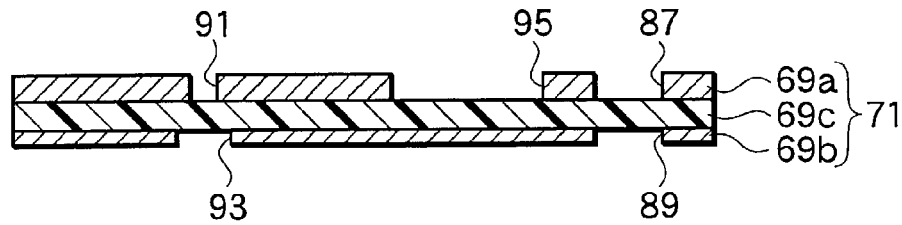
Figure 10E:
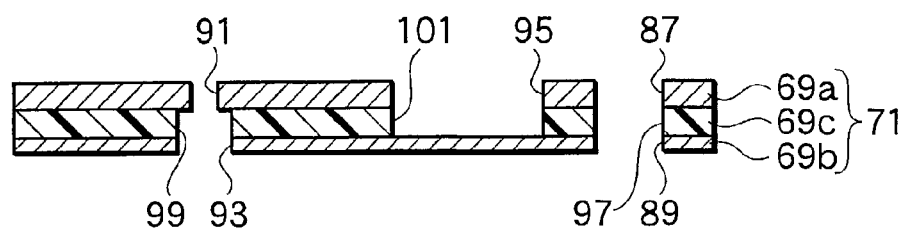

FIGS. 10A to 10E show a method of manufacturing the load beam 21 having the reinforcing part 45. FIG. 10A shows a multilayer base material forming process, FIG. 10B shows resist applying, exposing, developing processes, FIG. 10C shows an stainless steel etching process, FIG. 10D shows a resist removing process, and FIG. 10E shows a resin etching process.

In FIG. 10A, a three-layer base material 71 is formed with metal layers 69*a* and 69*b* and a resin layer 69*c* interposed between the metal layers 69*a* and 69*b*. If the rigid part 27 and reinforcing part 45 involve more layers, the base material 71 may have four or more layers by alternating metal and resin layers.

In FIG. 10B, resist films 73 and 75 are applied to top and bottom faces of the base material 71. The resist films 73 and 75 have openings 77, 79, 81, 83, and 85. Exposure and development processes are carried out to form removed areas 87, 89, 91, 93, and 95 in the metal layers 69*a* and 69*b* as shown in FIG. 10C.

In FIG. 10D, the resist films 73 and 75 are removed.

In FIG. 10E, etching is carried out to form removed areas 97, 99, and 101 in the resin layer 69*c*.

Through these processes, the removed areas 87, 89, and 97 form a through hole 47 of FIG. 6, the removed areas 91, 93, and 99 form the positioning through hole 33, and the removed areas 95 and 101 form the single-layer resilient part 29.

Figure 11:
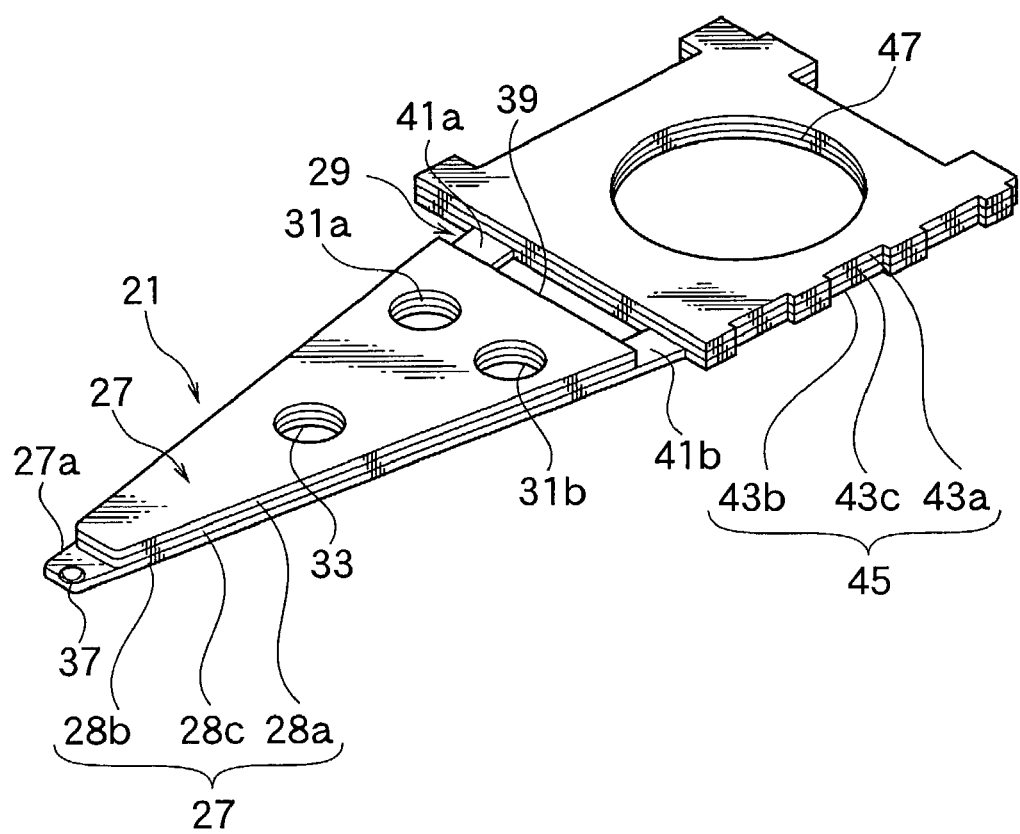
FIG. 11 is a perspective view showing a load beam of a head suspension for a disk drive according to a modification of the first embodiment.

FIG. 11 is a perspective view showing a load beam of a head suspension for a disk drive according to a modification of the first embodiment. The modification is basically the same as the first embodiment except that a resilient part 29 is integral with a metal layer 28*b*. As a result, the metal layer 28*b*, the resilient part 29, and a reinforcing metal layer 43*b* have each a thickness of t=38 mm, and a metal layer 28*a* and a reinforcing metal layer 43*a* have each a thickness of t=20 mm.

Figure 12:
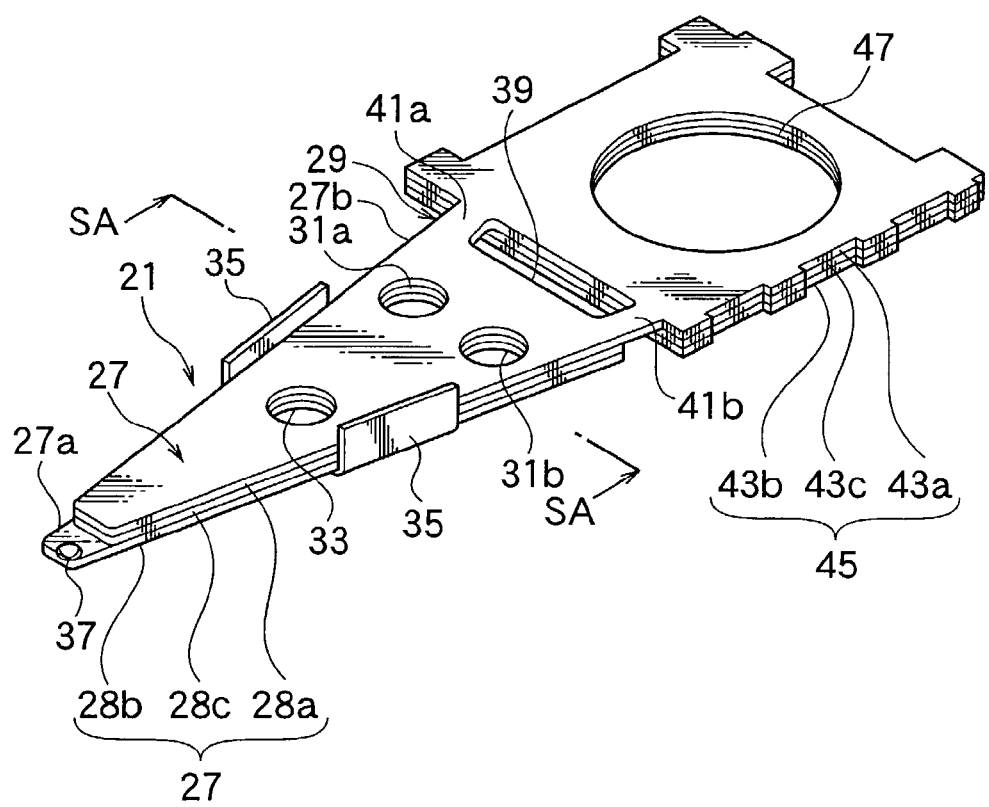
FIG. 12 is a perspective view showing a load beam of a head suspension for a disk drive according to another modification of the first embodiment.
Figure 13:
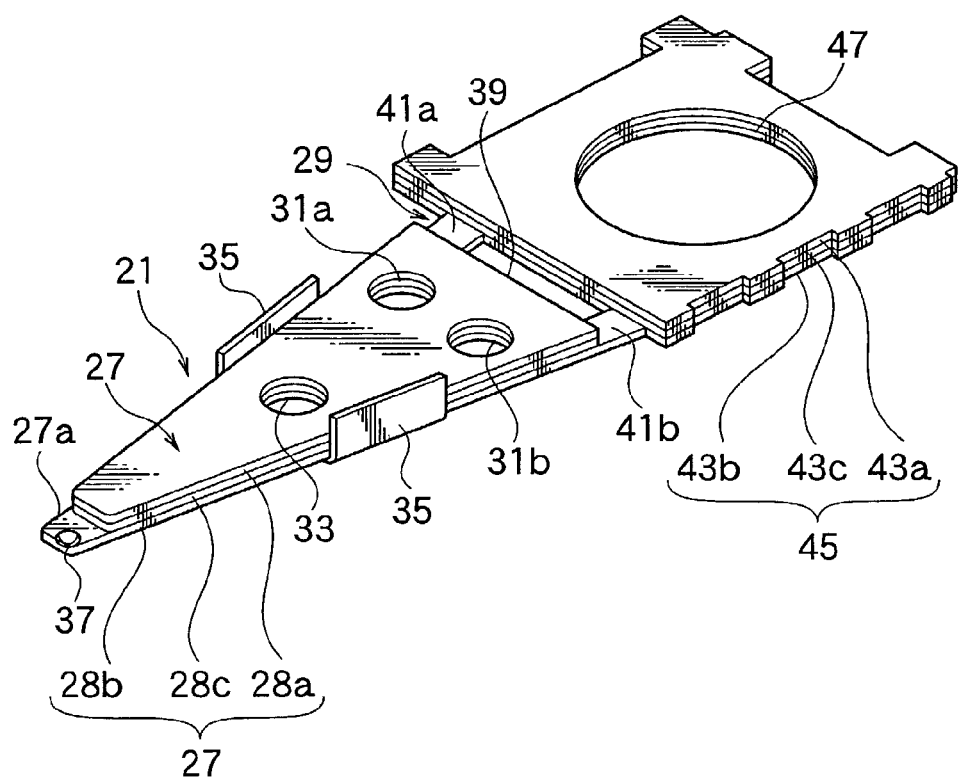
FIG. 13 is a perspective view showing a load beam of a head suspension for a disk drive according to still another modification of the first embodiment.

FIGS. 12 and 13 are perspective views showing load beams of head suspensions according to other modifications of the first embodiment, respectively. The load beam of FIG. 12 is based on the load beam of FIG. 6, and the load beam of FIG. 13 is based on the load beam of FIG. 11. In each of FIGS. 12 and 13, a rigid part 27 is provided with a channel 35. The channel 35 improves the rigidity of the rigid part 27. The channel 35 may have minimum dimensions because the rigid part 27 has the multilayer structure according to the present invention.

The channel 35 is made by preparing tongues on a metal layer 28*b* and by bending the tongues. Namely, the channel 35 and a dimple 37 are plastically formed only on the metal layer 28*b*. Compared with forming the channel 35 and dimple 37 on the three-layer rigid part 27, forming them only on the metal layer 28*b* is easier and more precise. The channel 35 may be formed only on a metal layer 28*a*, or on each of the metal layers 28*a* and 28*b*.

According to the first embodiment, the rigid part 27 has the multilayer structure including the metal layers 28*a* and 28*b* and the resin layer 28*c* interposed between the metal layers 28*a* and 28*b*, and the number of layers of the resilient part 29 is smaller than that of the rigid part 27. The reason why the present invention employs such a multilayer structure will be explained.

Figure 1:
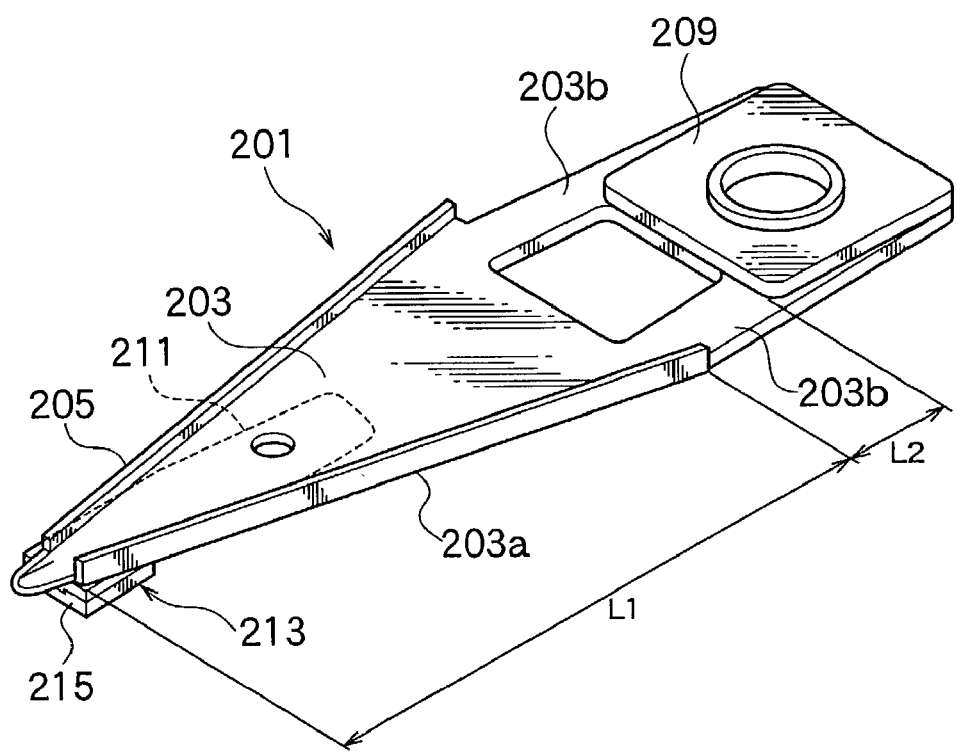
FIG. 1 is a perspective view showing a head suspension for a disk drive according to a related art.
Figure 2:
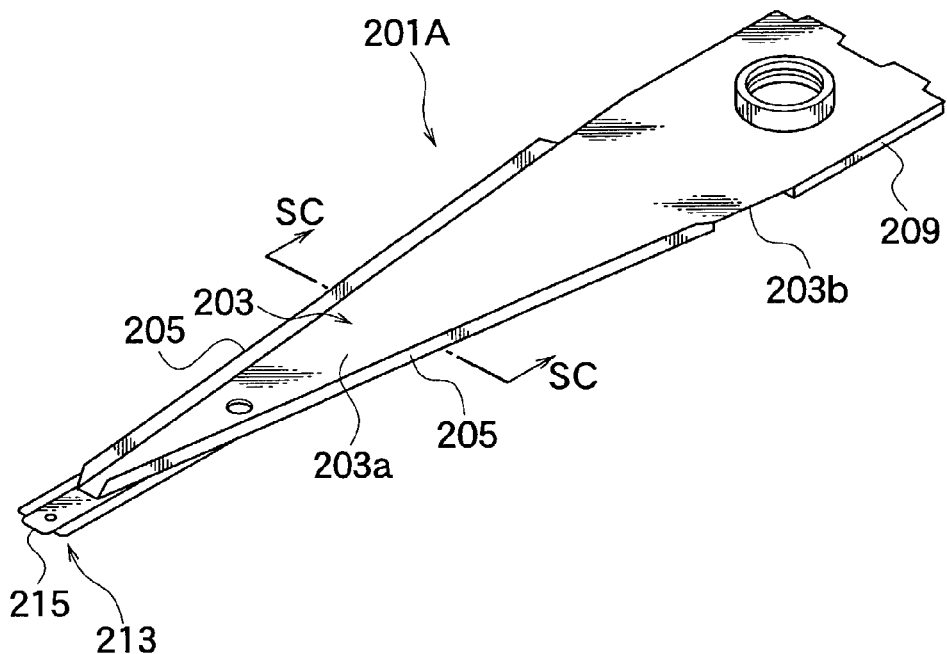
FIG. 2 is a perspective view showing a head suspension for a disk drive according to another related art.
Figure 3:
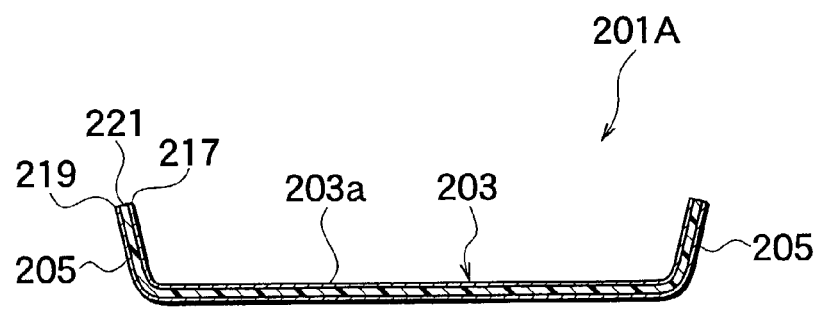
FIG. 3 is a sectional view taken along a line SC—SC of FIG. 2.

In the head suspension 201 of the related art of FIG. 1, it is important to control a torsional mode that causes large amplitudes at low frequencies. In the torsional mode, vibration at the base 209 characteristically differs from track-wise displacements due to air disturbance at the slider 215. The vibration of a head suspension due to air disturbance is called head suspension fluttering. In the following explanation, initial fluttering caused by the torsional mode is called T1 fluttering (first torsion mode fluttering), and that caused by the base plate vibration is called a gain.

The present inventor studied and analyzed the Z-shape (LB profile, i.e., length-breadth profile) of the load beam 203, gain frequency characteristics, and a relationship between T1 gains and Z-heights (in assembled states). The present inventor found that the T1 gains are controllable by controlling the LB profiles.

According to results of tests carried out by the present inventor, a relationship between T1 fluttering displacements and Z-heights becomes more problematic than a relationship between T1 gains and Z-heights when disks are rotated at high speed. Measures to cope with the problem will be explained.

(1) Weakening the sensitivity of a couple factor relative to a Z-height

The couple factor is expressed as follows:

$$\text{Couple factor} = \frac{T1 \text{ fluttering displacements}}{T1 \text{ amplitude of load beam}} \quad (1)$$

where the T1 amplitude of a load beam is measured at a channel in the vicinity of a dimple, and a T1 fluttering displacement is measured by a fluttering measuring device.

(2) Employing a damper to absorb vibration energy and reduce T1 amplitude (3) Shaping to resist air disturbance (4) Increasing torsional rigidity to reduce T1 amplitude In connection with the head suspension 201 of FIG. 1, the item (1) mentioned above is achievable by reducing the rigidity of the resilient part 203*b* in the Z-direction, shortening the resilient part 203*b*, and increasing the rigidity of the rigid part 203*a* in the Z-direction.

The item (2) is achievable by inserting a resin layer to provide a damping effect.

In connection with the item (3), various tests carried out by the present inventor showed that disks rotating at high speed cause air disturbance, which produces non-stationary fluid force in the Z-direction of a head suspension, to induce various vibration modes and cause suspension fluttering. Some measure must be taken to cope with this problem.

In connection with the item (4), the torsional rigidity of a load beam is calculable by analysis and can be set accordingly.

Assuming that the T1 fluttering is caused as mentioned above, a torsional angle q at a dimple of a load beam is calculable from a torsional rigidity S(x) obtained from an analysis and a moment M(x) generated when a non-stationary fluid force F(t) per unit area acts on a half face along the center axis of the load beam.

Figure 14A:
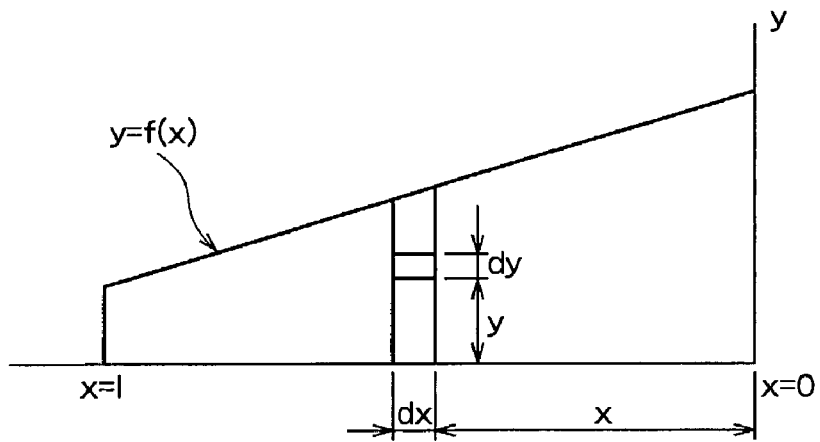
FIG. 14A shows a shape function of a load beam.
Figure 14B:
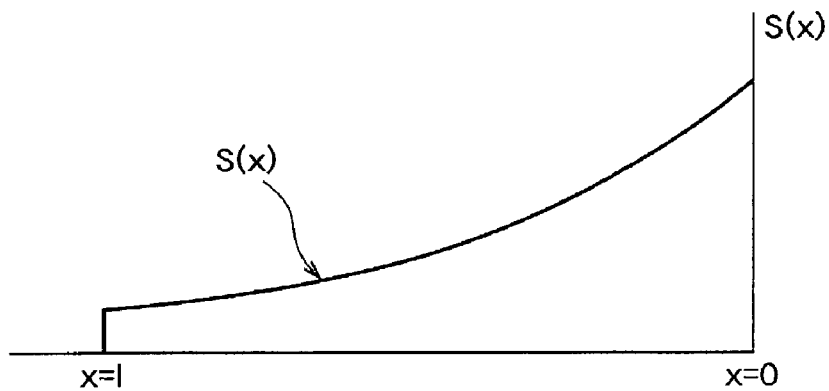
FIG. 14B shows torsional rigidity of a load beam.

A coordinate system is set as shown in FIGS. 14A and 14B in which FIG. 14A indicates a load beam shape function of y=f(x). The moment M(x) acting at a position x on a rigid part of the load beam is expressed as follows:

$$M(x) = \int_0^{f(x)} F(t) \cdot y \, dy \, dx \qquad (2)$$

As shown in FIG. 14B, the torsional rigidity S(x) is calculable as a function of x. From the expression (2) and S(x), the torsional angle at the dimple is as follows:

$$\theta = F(t) \int_0^1 \frac{\int_0^{f(x)} y \, dy}{S(x)} dx \qquad (3)$$

If the non-stationary fluid force F(t)=1, the expression (3) will be as follows:

$$\theta = \int_0^1 \frac{\int_0^{f(x)} y \, dy}{S(x)} dx \qquad (4)$$

From the expression (4) and results of tests carried out by the present inventor, it is said that the T1 amplitude and T1 fluttering displacement of a load beam relative to a Z-height decrease as the value of q decreases.

Moment M(x) and torsional rigidity for a load beam shape of f(x)=B are expressed as follows:

$$S(x) \propto \frac{G \cdot h^3 \cdot B}{x} \qquad (6)$$

where G is a modulus of transverse elasticity and h is the thickness of the load beam. From the expressions (4), (5), and (6), the torsional angle q at the dimple is as follows:

$$\theta \propto \int_0^{f(x)} \frac{x \cdot B}{G \cdot h^3} dx = \frac{B \cdot l^2}{2G \cdot h^3} \qquad (7)$$

The expression (7) shows that the torsional angle q decreases as the thickness h is increased, the length L is shortened, the width B is narrowed, and the modulus of rigidity G is increased.

A T1 frequency is expressed as follows:

$$T1 \text{ frequency} \propto \frac{h}{l \cdot B} \sqrt{\frac{G}{\rho}} \qquad (8)$$

If G/r is unchanged, the T1 frequency will be increased by thickening the thickness h, shortening the length L, and narrowing the width B. This is the same as the technique of reducing the torsional angle q but differs therefrom in degree.

Based on the findings mentioned above, the present inventor provides a head suspension with a multilayer structure.

FIG. 15 is a table showing a comparison between the weight of a three-layer structure according to the first embodiment and the weight of a related art. This table shows the lightness of the three-layer structure of the first embodiment.

In FIG. 15, a leftmost first column shows parts names, a second column shows thicknesses, a third column shows parts weights of the related art, a fourth column shows parts weights of a first three-layer structure, and fifth column shows parts weights of a second three-layer structure. The parts are base plates, load beams, resilient parts, flexures, and sliders.

The thickness of each base plate is t=0.15 mm, the thickness of each load beam is t=0.1 mm, and the thickness of each resilient part is t=38 mm.

The load beam of the related art is made of stainless steel (named SUS in the FIG. 15) and has a total thickness of t=100 mm. The first three-layer structure includes two metal layers made of stainless steel (named SUS in the FIG. 15) each having a thickness of t=25 mm and a polyimide (named PI in the FIG. 15) resin layer having a thickness of t=50 mm to provide a total thickness of t=100 mm.

The second three-layer structure includes two metal layers made of stainless steel (named SUS in the FIG. 15) having thicknesses of t=38 mm and t=20 mm, respectively, and a polyimide (named PI in the FIG. 15) resin layer having a thickness of t=42 mm to provide a total thickness of t=100 mm.

The parts weights of the related art shown in the third column provide a total weight of 51.0 mg. The parts weights of the first and second three-layer structures are in the fourth and fifth columns. The total weight of the first three-layer structure is 35.6 mg, and that of the second three-layer structure is 37.1 mg.

Namely, the first three-layer structure is 30% lighter than the related art, and the second three-layer structure is 27% lighter than the related art. Any three-layer structure according to the first embodiment is capable of improving the rigidity of the rigid part without increasing the thickness thereof and greatly reducing the weight thereof.

Figure 16A:
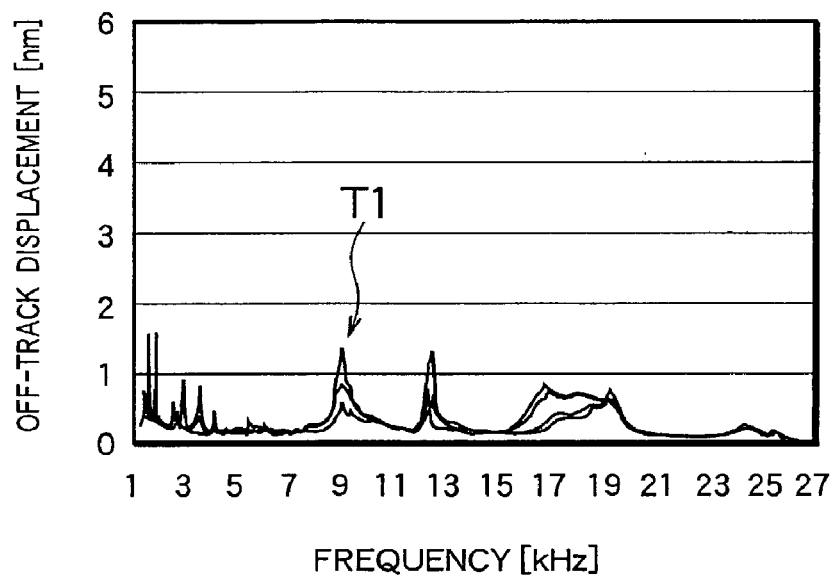
FIGS. 16A and 16B are graphs showing off-track displacements measured in air disturbance tests carried out on head suspensions of the first embodiment and related art.
Figure 16B:
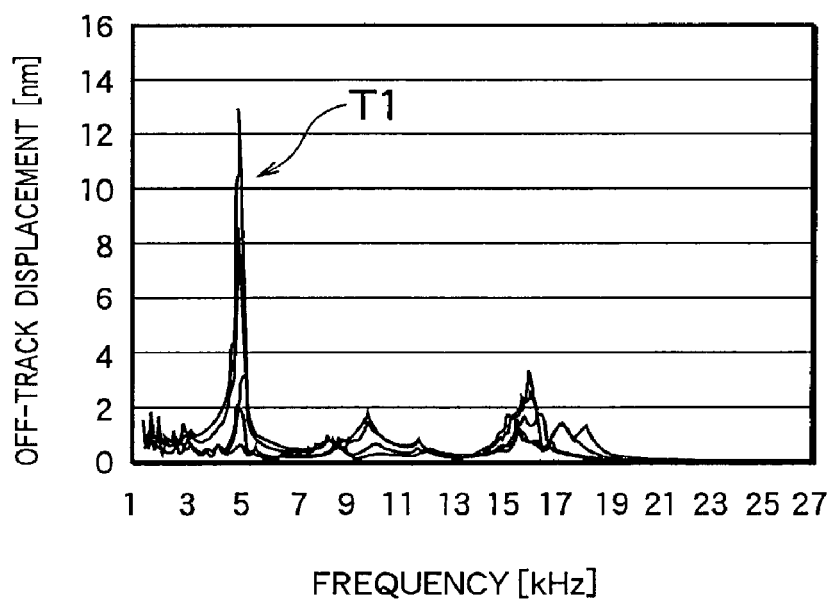
Figure 17A:
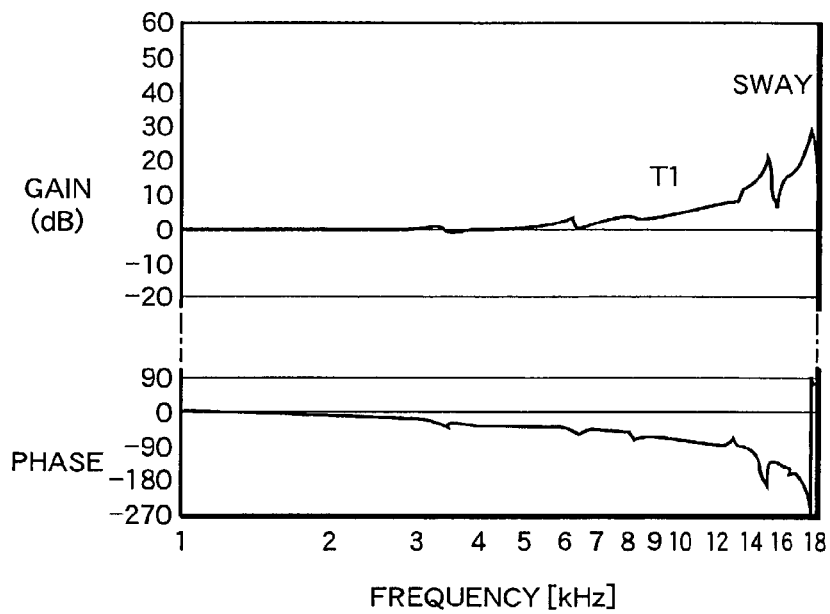
FIGS. 17A and 17B are graphs showing transfer functions measured in tests carried out on head suspensions of the first embodiment and related art.
Figure 17B:
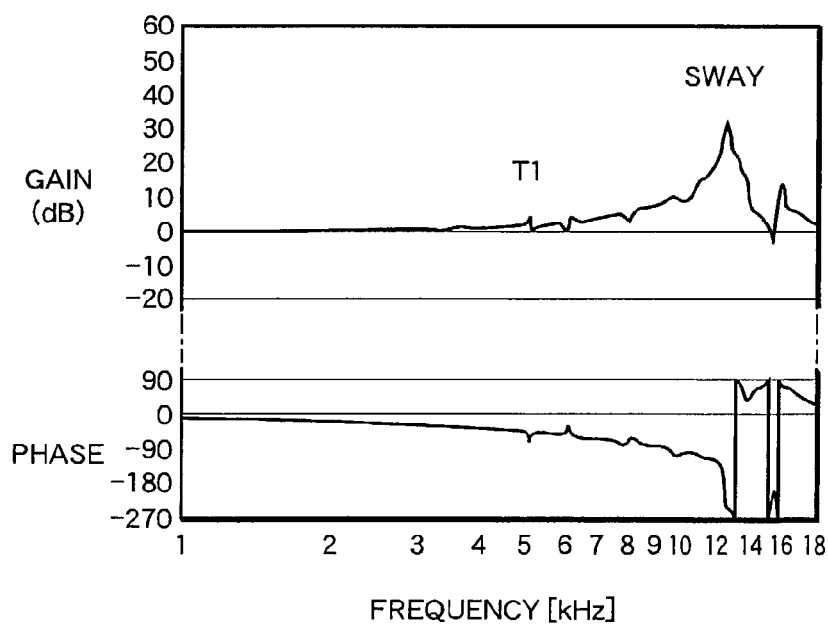
Figure 18A:
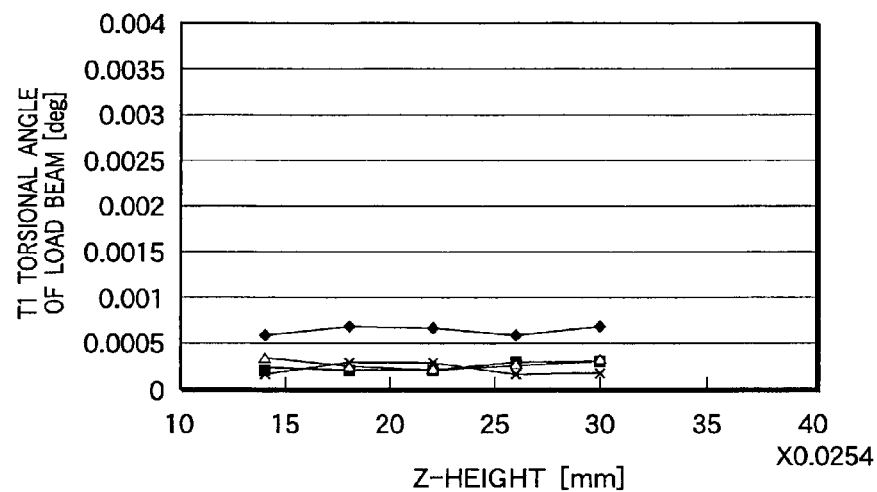
FIGS. 18A and 18B are graphs showing a relationship between Z-heights and T1 (first torsion mode) torsional angles measured in tests carried out on head suspensions of the first embodiment and related art.
Figure 18B:
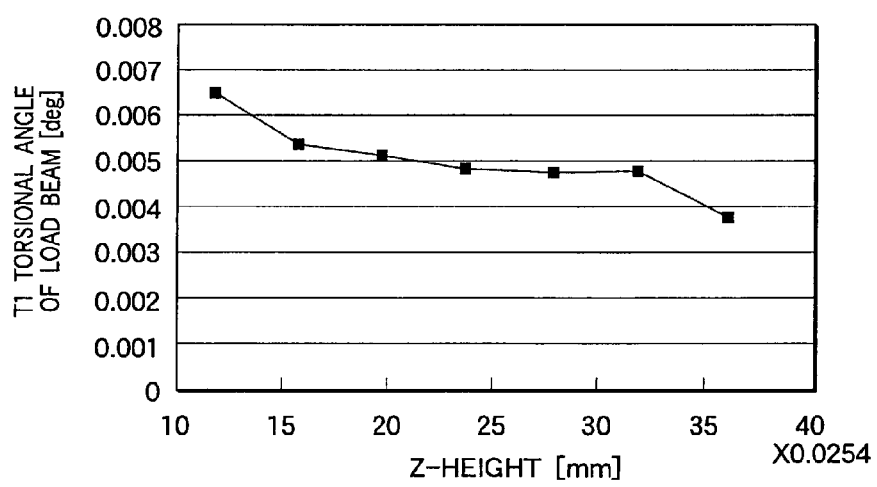
Figure 19A:
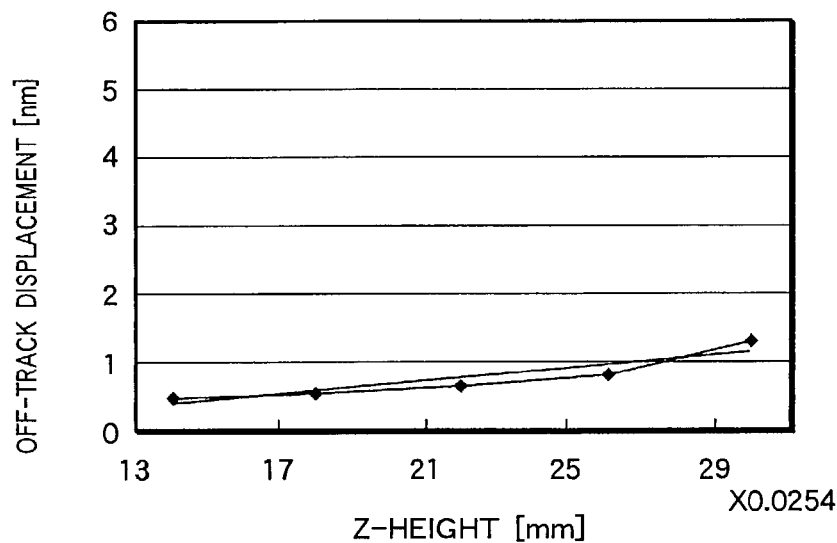
FIGS. 19A and 19B are graphs showing a relationship between Z-heights and T1 off-track displacements measured in tests carried out on head suspensions of the first embodiment and related art.
Figure 19B:
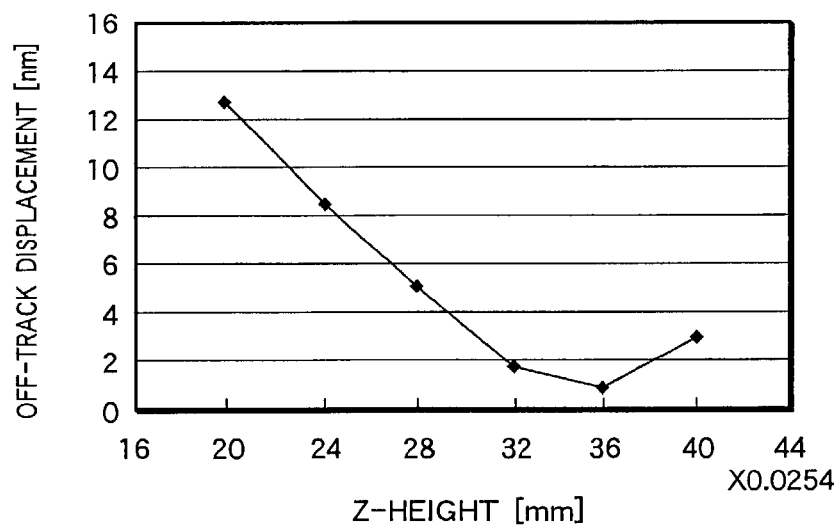

FIGS. 16A and 19B show test results carried out on head suspensions of the first embodiment and related art, in which FIGS. 16A and 16B show off-track displacements measured in air disturbance tests, FIGS. 17A and 17B show results of transfer function tests, FIGS. 18A and 18B show T1 torsional angles relative to Z-heights (in assembled states) measured in air disturbance tests, and FIGS. 19A and 19B show T1 off-track displacements relative to Z-heights measured in air disturbance tests. FIG. 20 is a table showing a summary of the test results.

The test results in FIGS. 16A, 17A, 18A, and 19A relate to the head suspension 11 of the first embodiment, and those in FIGS. 16B, 17B, 18B, and 19B relate to the related art. In FIG. 20, the three-layer load beam of the first embodiment consists of stainless steel (named SUS in the FIG. 20) layers having thicknesses of t=38 mm and t=20 mm, respectively, and a polyimide (named PI in the FIG. 20) resin layer having a thickness of t=42 mm. The three-layer structure has a total weight of 37.1 mg. The load beam of the related art is made of a stainless steel (named SUS in the FIG. 20) layer having a thickness of t=51 mm and a weight of 49.1 mg. Measurements were made with a laser Doppler speed meter, and gain measurements were made on base plate vibration, where a gain is a quotient of output divided by input. Fluttering measurements were made by rotating disks and observing swaying, where a measurement value is an output value.

Test results concerning resonance characteristics are in FIGS. 17A and 17B, and those concerning air disturbance characteristics are in FIGS. 16A, 16B, 18A, 18B, 19A, and 19B. Off-track displacements due to air disturbance are in FIGS. 17A and 17B. The Z-height sensitivity of T1 off-track displacements is shown in FIGS. 19A and 19B, and the Z-height sensitivity of torsional angles is shown in FIGS. 18A and 18B. In FIGS. 18A, 18B, 19A, and 19B, a unit on an abscissa is a millimeter and a magnitude on the abscissa is derived by 0.0254 times a two-digit number on the abscissa.

In FIG. 16A, the three-layer structure shows a T1 resonance frequency of 9.0 kHz. On the other hand, the related art of FIG. 16B shows a T1 resonance frequency of 5.0 kHz. Namely, the three-layer structure is advantageous in increasing a T1 fluttering resonance frequency.

In connection with swaying, the three-layer structure of FIG. 17A shows a resonance frequency of 17.8 kHz, while the related art of FIG. 17B shows a resonance frequency of 12.5 kHz. Namely, the three-layer structure is advantageous in increasing a swaying resonance point. The swaying is determined from a phase change.

In connection with T1 torsional angles due to air disturbance, the three-layer structure of FIG. 18A shows an average torsional angle of 0.0004 degrees irrespective of Z-heights. The related art of FIG. 18B shows an average torsional angle of 0.005 degree. Namely, the three-layer structure shows a torsional angle due to air disturbance smaller than 1/10 of that of the related art. The three-layer structure is advantageous in resisting air disturbance.

In connection with T1 off-track displacements due to air disturbance, the three-layer structure of FIG. 19A is stable irrespective of Z-height variations and shows little inclination. On the other hand, the related art of FIG. 19B shows large changes in response to Z-height variations and a steep inclination. The Z-height variations occur due to deviations from a designed Z-height caused by manufacturing and assembling errors. The T1 off-track displacements of the three-layer structure are within an allowable Z-height variation range, to realize high reliability. On the other hand, the related art shows large T1 off-track displacements between 36×0.0254 mm and 20×0.0254 mm in Z-height and demonstrates the poorest reliability at a Z-height of 20×0.0254 mm. Compared with the related art, the three-layer structure of the present invention well reduces fluttering due to air disturbance, minimizes read/write errors, and is useful to increase track densities.

These test results agree with the consideration of the present inventor. Namely, the three-layer structure is effective to reduce the weight of a head suspension for a disk drive, improve the rigidity of a rigid part (27), realize a low spring constant for a resilient part (29), and secure the advantages mentioned above.

The base 19 (FIG. 5) of the first embodiment is formed by attaching the three-layer reinforcing part 45 to the base plate 22, which is fixed to the carriage arm 9 (FIG. 4). The base 19, therefore, is light, surely reinforces the base plate 22, and stably supports the load beam 21 on the carriage 5.

In this way, the head suspension according to the first embodiment is light, minimizes the amplitudes of various resonance modes, increases resonance frequencies, and surely prevents fluttering due to air disturbance.

Second Embodiment

Figure 21:
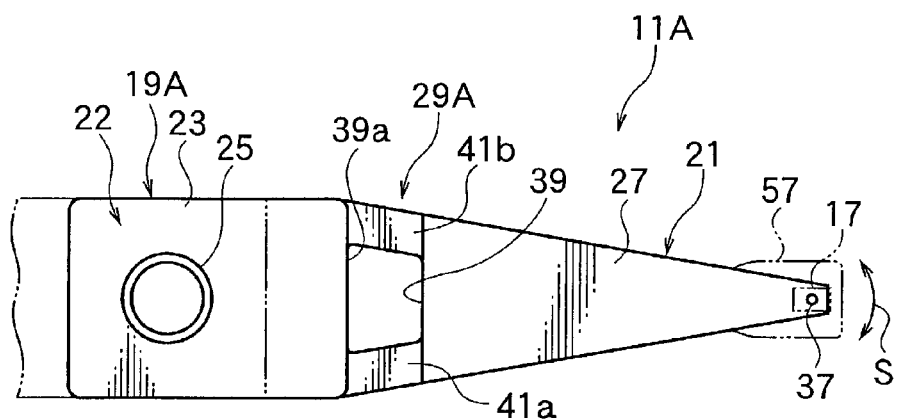
FIG. 21 is a plan view showing a head suspension for a disk drive according to a second embodiment of the present invention.
Figure 22:
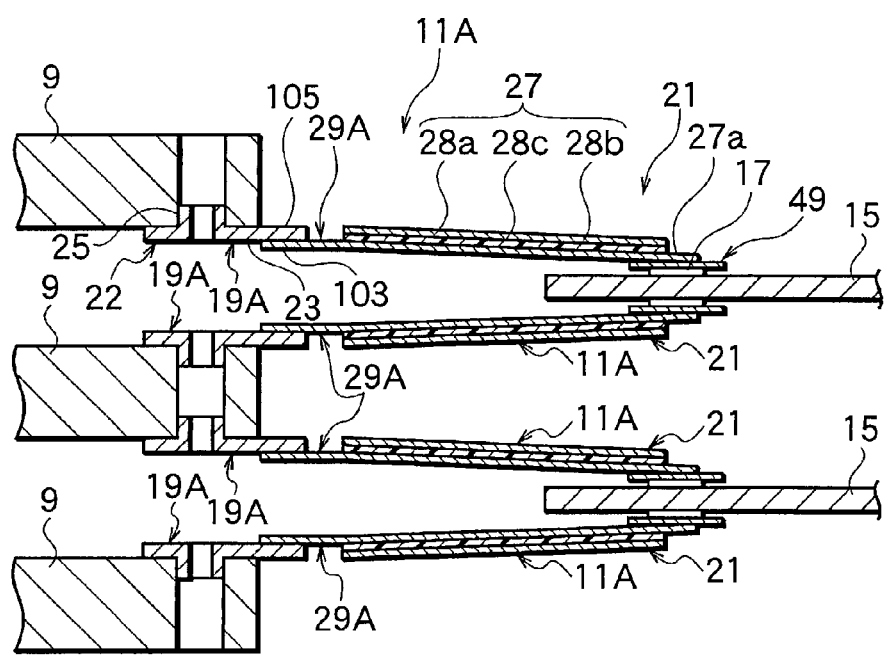
FIG. 22 is a sectional view partly showing a hard disk drive according to the second embodiment.

FIG. 21 is a plan view showing a head suspension 11A for a disk drive according to the second embodiment of the present invention, and FIG. 22 is a sectional view showing head suspensions 11A attached to carriage arms 9. Parts corresponding to those of the first embodiment are represented with like reference numerals.

The head suspension 11A is appropriate when the distance between a fitting point on the carriage arm 9 and a dimple 37 is long. A rigid part 27 of the head suspension 11A has a three-layer structure including metal layers 28a and 28b and a resin layer 28c interposed between the metal layers 28a and 28b. A resilient part 29A of the head suspension 11A is integral with the metal layers 28b and is formed at an end of the rigid part 27. Opposite the rigid part 27, the resilient part 29A has an integral support 103.

A base 19A of the head suspension 11A has a base plate 22. A flange 23 of the base plate 22 is provided with an extension 105. The extension 105 is fixed to the support 103 of the resilient part 29A, for example, laser welding.

The rigid part 27 has the three-layer structure including the metal layers 28a and 28b and the resin layer 28c interposed between the metal layers 28a and 28b, to reduce the weight thereof and improve the rigidity thereof. The resin layer 28c provides a damping effect. The resilient part 29A is integral with the metal layer 28b, to provide a low spring constant.

The second embodiment provides substantially the same effects as the first embodiment. According to the second embodiment, the support 103 that is integral with the resilient part 29A is fixed to the extension 105 of the base plate 22 by, for example, laser welding, to realize easy manufacturing and reduce weight.

Third Embodiment

Figure 23:
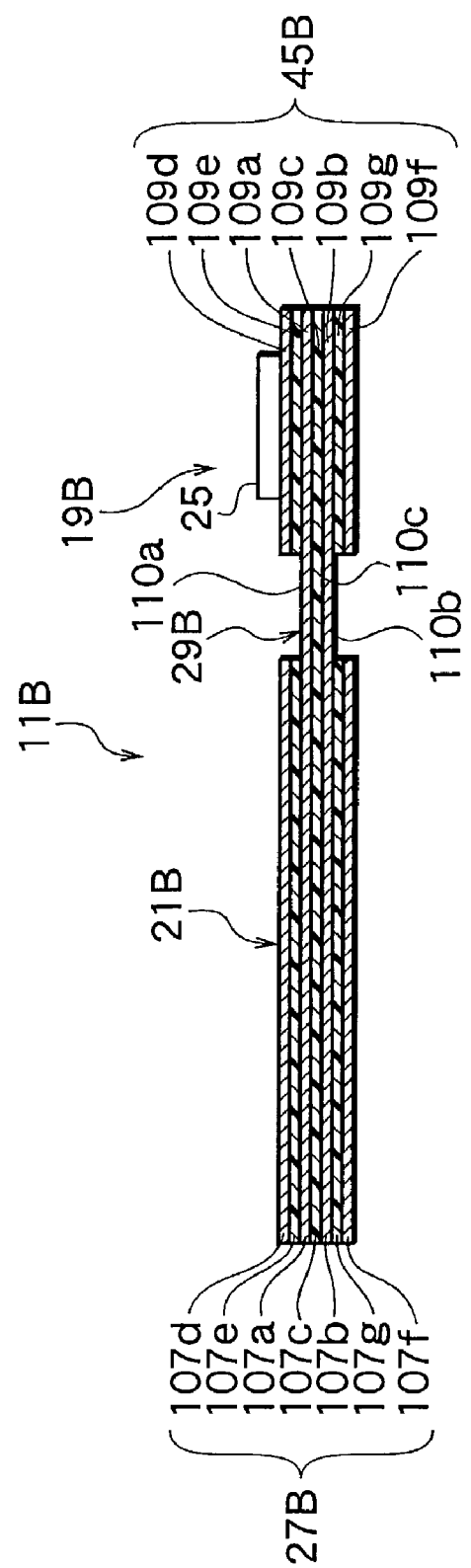
FIG. 23 is a sectional view showing a head suspension for a disk drive according to a third embodiment of the present invention.

FIG. 23 is a sectional view showing a head suspension 11B for a disk drive according to the third embodiment of the present invention. Parts corresponding to those of the first embodiment are represented with like reference numerals.

A reinforcing part 45B of the head suspension 11B has lightening holes (not shown). A base 19B of the head suspension 11B has a boss 25 having a hole (not shown).

The head suspension 11B has a load beam 21B including a rigid part 27B and a resilient part 29B. According to the third embodiment, the rigid part 27B has a three-layer structure including metal layers 107a and 107b and a resin layer 107c interposed between the metal layers 107a and 107b, plus resin layers 107e and 107g formed on top and bottom faces of the three-layer structure, respectively, and metal layers 107d and 107f formed on the resin layers 107e and 107g, respectively. Namely, the rigid part 27B has a seven-layer structure.

Like the rigid part 27B, the reinforcing part 45B of the base 19B has a seven-layer structure consisting of reinforcing metal layers 109a, 109b, 109d, and 109f and resin layers 109c, 109e, and 109g.

The resilient part 29B consists of a metal layer 110a integral with the metal layer 107a and reinforcing metal layer 109a, a metal layer 110b integral with the metal layer 107b and reinforcing metal layer 109b, and a resin layer 110c integral with the resin layers 107c and 109c. Namely, the resilient part 29B has a three-layer structure whose number of layers is smaller than that of the rigid part 27B or the reinforcing part 45B.

The third embodiment employs no base plate and fixes the boss 25 directly to the reinforcing metal layer 109d of the reinforcing part 45B. The thicknesses of the rigid part 27B, resilient part 29B, and reinforcing part 45B may be the same as those of the first embodiment.

The multilayer rigid part 27B and reinforcing part 45B and the multilayer resilient part 29B having a smaller number of layers provide the same effects as those of the first embodiment. With a larger number of resin layers, the third embodiment further reduces the weight of the head suspension.

According to the third embodiment, the reinforcing part 45B may consist of a single reinforcing metal layer. The boss 25 of the base 19B may be omitted and the reinforcing part 45B may directly be attached to the carriage arm 9.

The resilient part 29B may have a two-layer structure consisting of the metal layer 110a or 110b and the resin layer 110c. Alternatively, the resilient part 29B may have a single layer structure consisting of the metal layer 110a or 110b. The metal layers 110a and 110b and the resin layer 110c may be layered in optional order. Namely, the resin layer 110c may not be sandwiched between the metal layers 110a and 110b. For example, one of the metal layers 110a and 110b may be replaced with a resin layer. In this case, the two resin layers 110c and 110a or 110b may be made of different resin materials.

Fourth Embodiment

FIG. 24 is a sectional view showing a head suspension 11C for a disk drive according to the fourth embodiment of the present invention. Parts corresponding to those of the first embodiment are represented with like reference numerals. A reinforcing part 45C of the head suspension 11C has lightening holes (not shown), and a base plate 22 has a hole (not shown).

The head suspension 11C has a load beam 21C including a rigid part 27C and a resilient part 29C. According to the fourth embodiment, the rigid part 27C has a three-layer structure consisting of metal layers 111a and 111b and a resin layer 111c interposed between the metal layers 111a and 111b. A base 19C of the head suspension 11C has the reinforcing part 45C. The reinforcing part 45C has a three-layer structure consisting of reinforcing metal layers 113a and 113b and a resin layer 113c interposed between the reinforcing metal layers 113a and 113b.

The resilient part 29C is independent of the rigid part 27C and reinforcing part 45C and is joined to the metal layer 111b of the rigid part 27C and the reinforcing metal layer 113b of the reinforcing part 45C by, for example, laser welding. The thicknesses of the rigid part 27C, resilient part 29C, and reinforcing part 45C are same as those of the first embodiment.

The three-layer structure of the rigid part 27C, the single-layer structure of the resilient part 29C, and the three-layer structure of the reinforcing part 45C provide substantially the same effects as the first embodiment. The resilient part 29C of the fourth embodiment is a separate part, and therefore, the thickness and shape of the resilient part 29C can optionally be determined.

The structure of the rigid part 27C is not limited to the three-layer structure. It may have more resin and metal layers to have four or more layers in total. The reinforcing part 45C may also have more layers. Alternatively, the reinforcing part 45C may have a two-layer structure consisting of a reinforcing metal layer and a resin layer, or a single-layer structure consisting of a reinforcing metal layer.

The base 19C may have no base plate 22. In this case, the reinforcing part 45C is directly fixed to the carriage arm 9. The resilient part 29C may be extended under the rigid part 27C as indicated with a dot-and-dash line, or under the reinforcing part 45C as indicated with a dot-and-dash line. If the resilient part 29C is extended in one of the two directions, it will not be extended in the other direction.

What is claimed is:

1. A head suspension for a disk drive, comprising:
   a base to be attached to a carriage;
   a load beam having a rigid part and a resilient part supported by the base, to apply load on a data read/write head arranged at a front end of the rigid part, the rigid part having a first side edge and a second side edge opposing one another and extending in a direction from the carriage to the head; and
   a flexure attached to the load beam and being provided with the head,
   the rigid part having a multilayer structure including at least three layers extending from the first side edge to the second side edge, the three layers including metal plates and a resin plate interposed between the metal plates,
   the number of layers of the resilient part being smaller than that of the rigid part, and
   the resilient part including at least one metal plate and having a top and bottom surface of bare metal.

2. A head suspension for a disk drive, comprising:
   a base to be attached to a carriage;
   a load beam having a rigid part and a resilient part supported by the base, to apply load on a data read/write head arranged at a front end of the rigid part; and
   a flexure attached to the load beam and being provided with the head,
   the rigid part having a multilayer structure including at least three layers including metal plates and a resin plate interposed between the metal plates,
   the number of layers of the resilient part being smaller than that of the rigid part, and
   the resilient part including at least one metal plate and having a top and bottom surface of bare metal, wherein:
      the multilayer structure of the rigid part is a three-layer structure including two metal plates and a resin plate interposed between the metal plates;
      the resilient part is integrally formed with one of the metal plates of the rigid part at an end of the rigid part;
      opposite the rigid part, the resilient part has an integral reinforcing metal layer to reinforce the base;

the reinforcing metal layer, another reinforcing metal layer, and a resin layer interposed between the reinforcing metal layers form a multilayer reinforcing part including at least three layers; and the reinforcing part is attached to a base plate, to form the base to be attached to the carriage.

3. The head suspension of claim 1, wherein:

the rigid part is provided with a three-layer structure including two metal plates and a resin plates interposed between the metal plates;

the resilient part is integrally formed with one of the metal plates of the rigid part at an end of the rigid part;

opposite the rigid part, the resilient part has an integral support; and the support is supported to a base plate, to form the base to be attached to the carriage.

4. A head suspension for a disk drive, comprising:

a base to be attached to a carriage;

a load beam having a rigid part and a resilient part supported by the base, to apply load on a data read/write head arranged at a front end of the rigid part; and a flexure attached to the load beam and being provided with the head, the rigid part having a multilayer structure including at least three layers including metal layers and a resin layer interposed between the metal layers, the base having a multilayer structure including at least three layers including reinforcing metal layers and a resin layer interposed between the reinforcing metal layers, the resilient part including only one metal plate and being independent of the rigid part and base and being joined to one of the metal layers of the rigid part and one of the reinforcing metal layers of the base, and the metal plate forming a top and bottom surface of the resilient part.

5. A head suspension comprising:

a base to be attached to a carriage;

a load beam having a rigid part and a resilient part supported by the base, to apply load on a data read/write head arranged at a front end of the rigid part; and a flexure attached to the load beam and being provided with the head, the rigid part having a multilayer structure including at least three layers including metal layers and a resin layer interposed between the metal layers, the number of layers of the resilient part being smaller than that of the rigid part, wherein the resin layer and one metal layer of the rigid part are provided with lightening holes at a position where the flexure is fixed to the other metal layer of the rigid part.

6. A head suspension, comprising:

a base to be attached to a carriage;

a load beam having a rigid part and a resilient part supported by the base, to apply load on a data read/write head arranged at a front end of the rigid part; and a flexure attached to the load beam and being provided with the head, the rigid part having a multilayer structure including at least three layers including metal layers and a resin layer interposed between the metal layers, the number of layers of the resilient part being smaller than that of the rigid part, wherein:

the rigid part is provided with a three-layer structure including two metal layers and a resin layer interposed between the metal layers;

the resilient part is integrally formed with one of the metal layers of the rigid part at an end of the rigid part;

opposite the rigid part, the resilient part has an integral reinforcing metal layer to reinforce the base;

the reinforcing metal layer, another reinforcing metal layer, and a resin layer interposed between the reinforcing metal layers form a multilayer reinforcing part including at least three layers;

the reinforcing part is attached to a base plate, to form the base to be attached to the carriage; and the resin layer and one metal layer of the rigid part are provided with lightening holes at a position where the flexure is fixed to the other metal layer of the rigid part.

7. A head suspension, comprising:

a base to be attached to a carriage;

a load beam having a rigid part and a resilient part supported by the base, to apply load on a data read/write head arranged at a front end of the rigid part; and a flexure attached to the load beam and being provided with the head, the rigid part having a multilayer structure including at least three layers including metal layers and a resin layer interposed between the metal layers, the number of layers of the resilient part being smaller than that of the rigid part, wherein:

the rigid part is provided with a three-layer structure including two metal layers and a resin layer interposed between the metal layers;

the resilient part is integrally formed with one of the metal layers of the rigid part at an end of the rigid part;

opposite the rigid part, the resilient part has an integral support;

the support is supported to a base plate, to form the base to be attached to the carriage; and the resin layer and one metal layer of the rigid part are provided with lightening holes at a position where the flexure is fixed to the other metal layer of the rigid part.

8. A head suspension, comprising:

a base to be attached to a carriage;

a load beam having a rigid part and a resilient part supported by the base, to apply load on a data read/write head arranged at a front end of the rigid part; and a flexure attached to the load beam and being provided with the head, the rigid part having a multilayer structure including at least three layers including metal layers and a resin layer interposed between the metal layers, the base having a multilayer structure including at least three layers including reinforcing metal layers and a resin layer interposed between the reinforcing metal layers, the resilient part being independent of the rigid part and base and being joined to one of the metal layers of the rigid part and one of the reinforcing metal layers of the base, wherein the resin layer and one metal layer of the rigid part are provided with lightening holes at a position where the flexure is fixed to the other metal layer of the rigid part.

9. A head suspension, comprising:

a base to be attached to a carriage;

a load beam having a rigid part and a resilient part supported by the base, to apply load on a data read/write head arranged at a front end of the rigid part; and a flexure attached to the load beam and being provided with the head, the rigid part having a multilayer structure including at least three layers including metal layers and a resin layer interposed between the metal layers, the number of layers of the resilient part being smaller than that of the rigid part, wherein:

the rigid part is provided with a three-layer structure including two metal layers and a resin layer interposed between the metal layers;

the resilient part is integrally formed with one of the metal layers of the rigid part at an end of the rigid part;

opposite the rigid part, the resilient part has an integral reinforcing metal layer to reinforce the base;

the reinforcing metal layer, another reinforcing metal layer, and a resin layer interposed between the reinforcing metal layers form a multilayer reinforcing part including at least three layers;

the reinforcing part is attached to a base plate, to form the base to be attached to the carriage;

the base is provided with a base plate to be attached to the carriage; and the base plate is fixed to one of the reinforcing metal layers of the base at a position where lightening holes are formed in the other reinforcing metal layer and resin layer of the base.

10. A head suspension, comprising:

a base to be attached to a carriage;

a load beam having a rigid part and a resilient part supported by the base, to apply load on a data read/write head arranged at a front end of the rigid part; and a flexure attached to the load beam and being provided with the head, the rigid part having a multilayer structure including at least three layers including metal layers and a resin layer interposed between the metal layers, the base having a multilayer structure including at least three layers including reinforcing metal layers and a resin layer interposed between the reinforcing metal layers, the resilient part being independent of the rigid part and base and being joined to one of the metal layers of the rigid part and one of the reinforcing metal layers of the base, wherein:

the base is provided with a base plate to be attached to the carriage; and the base plate is fixed to one of the reinforcing metal layers of the base at a position where lightening holes are formed in the other reinforcing metal layer and resin layer of the base.

11. The head suspension of claim 5, wherein the lightening holes are formed by etching.

12. The head suspension of claim 6, wherein the lightening holes are formed by etching.

13. The head suspension of claim 7, wherein the lightening holes are formed by etching.

14. The head suspension of claim 8, wherein the lightening holes are formed by etching.

15. The head suspension of claim 9, wherein the lightening holes are formed by etching.

16. The head suspension of claim 10, wherein the lightening holes are formed by etching.

17. The head suspension of any one of claims, 4–7, 9, 10, 13, 14, 15 and 16, wherein at least one of the metal layers of the rigid part is provided with a plastically processed part.

18. The head suspension of any one of claims 1–3, wherein at least one of the metal plates of the rigid part is provided with a plastically processed part.

* * * * *